United States Patent [19]

Matsuzawa et al.

[11] Patent Number: 4,962,990
[45] Date of Patent: Oct. 16, 1990

[54] OPTICAL DEVICE

[75] Inventors: Soichiro Matsuzawa, Kuwana; Yoshinari Kozuka, Nagoya; Shuhei Toyoda, Nagoya; Shogo Kawaguchi, Nagoya; Masami Matsuura, Ama, all of Japan

[73] Assignee: NGK Insulators, Ltd., Japan

[21] Appl. No.: 328,282

[22] Filed: Mar. 24, 1989

[30] Foreign Application Priority Data

Mar. 25, 1988 [JP] Japan .................................. 63-71114

[51] Int. Cl.$^5$ ............................ G02B 6/26; G02B 6/36
[52] U.S. Cl. ................................ 350/96.20; 350/96.18
[58] Field of Search ............... 350/96.20, 96.21, 96.18, 350/245, 287, 406

[56] References Cited

U.S. PATENT DOCUMENTS 4,030,811  6/1977  Khoe et al. ........................ 350/96.17
4,303,303 12/1981  Aoyama ............................ 350/96.20
4,322,126  3/1982  Minowa et al. ................... 350/96.20

FOREIGN PATENT DOCUMENTS 63-98568  4/1983  Japan .
62-45527  9/1987  Japan .

OTHER PUBLICATIONS

"Fiber-Optic Current and Voltage Meters", *National Technical Report*; vol. 29, No. 5, Oct. 1983, pp. 70-79.
"Principle and Application of Optical Fiber Sensor" Mitsubishi Denki Giho, vol. 57, No. 10, 1983, pp. 62-65.
"Optical Fiber Sensor" M. Nunoshita & K. Kyuma, pp. 102-107.

*Primary Examiner*—Akm Ullah
*Attorney, Agent, or Firm*—Arnold, White & Durkee

[57] ABSTRACT

An optical device including an optical bench and a plurality of optical elements. The optical bench has first and second supporting sections, separated from each other, each having at least two supporting surfaces. The optical elements secured to the first and second supporting sections have cylindrical bodies, so that these optical elements contact the sections only by lines. Therefore, the relative positions of each optical elements in the optical device are maintained for a long time without being affected by temperature variation in the atmosphere surrounding the optical device.

19 Claims, 6 Drawing Sheets

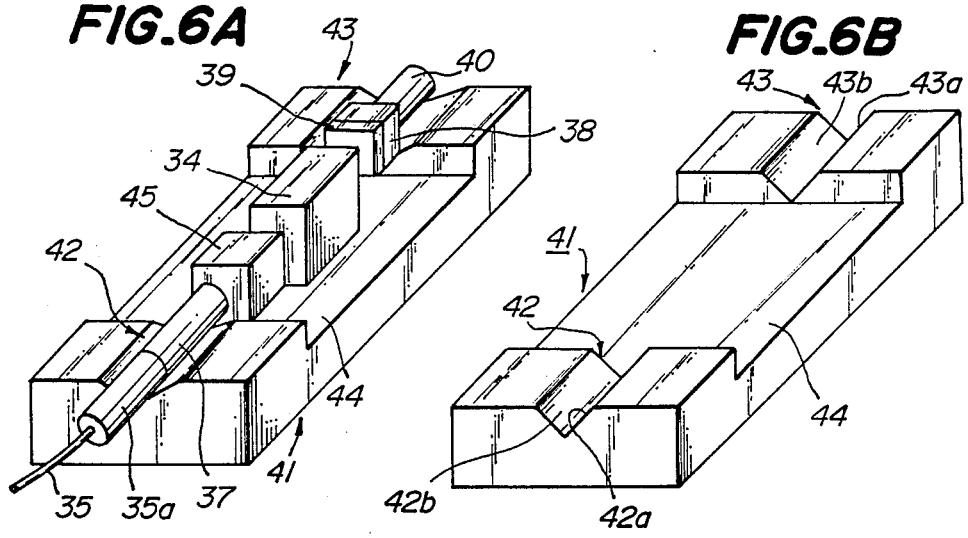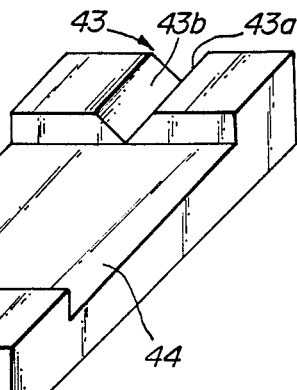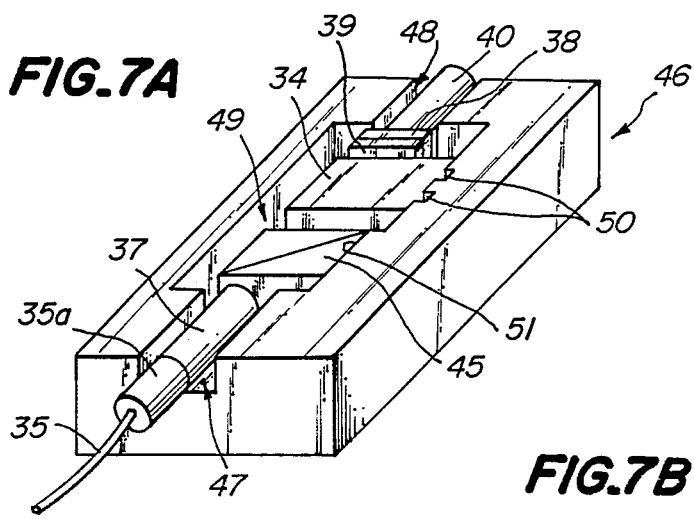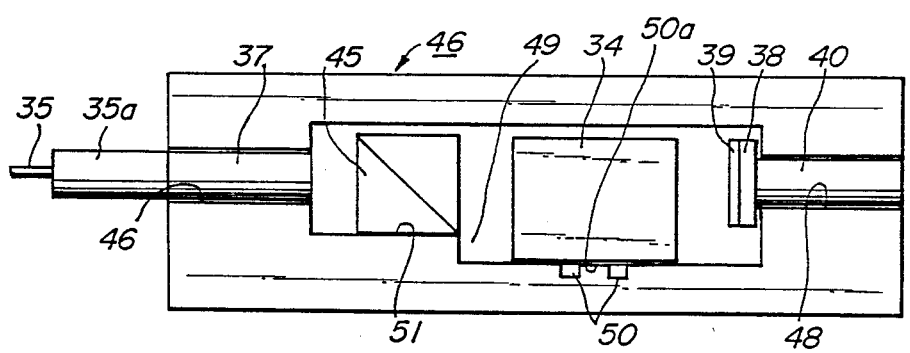

OPTICAL DEVICE

FIELD OF THE INVENTION AND RELATED ART STATEMENT

The present invention relates to an optical device comprising an optical bench and a plurality of optical elements which are secured on the optical bench, more particularly to an optical device for used in a fiber optic current meter or a fiber optic voltage meter by which an electric current or an electric voltage can be measured by measuring a variation of an amount of light which passes through the optical elements.

In the optical device according to the invention, a single crystal of oxide is provided in order to detect and measure the electric current or electric voltage by utilizing the electro-optical effect or a magneto-optical effect thereof.

FIGS. 1~3 show known optical devices for use in the fiber-optic meters. FIG. 1 is a sideview illustrating a known reflection-type optical device which comprises an optical fiber 1 supported by a ferrule 2, a polarizer/analyzer 3, a rod lens 4, an electro-optical element 5, a phase plate 6 and a reflector plate 7, these elements being integrated as one body in the above mentioned order viewed from a light incident side. FIG. 2 is a sideview depicting a known U-shaped optical device in which there are provided optical fibers 8a, 8b each supported by ferrules 9a, 9b, rod lenses 10a, 10b, a polarizer 11, a phase plate 12, an electro-optical element 13 and an analyzer 14. In this U-shaped optical sensor, the polarizer 11, the phase plate 12, the electro-optical element 13 and the analyzer 14 are serially connected to each other to form an assembly A, the optical fiber 8a, the ferrule 9a and the rod lens 10a form an assembly B; and the optical fiber 8b, the ferrule 9b and the rod lens 10b form an assembly C. The assemblies B and C are made parallel with each other and each end of the rod lenses 10a and 10b are secured to the assembly A so as to be made perpendicular thereto, as shown in FIG. 2. FIG. 3 is a side view illustrating a known transmission-type optical device in which there are arranged optical fibers 15a, 15b each supported by ferrules 16a and 16b, which are arranged at each end portion of the device, rod lenses 17a, 17b each connected to each end of the optical fibers 15a and 15b, an analyzer 18 situated between the optical fiber 15a and the rod lens 17a, a polarizer 19 situated between the optical fiber 15b and the rod lens 17b, a phase plate 20 and an electro-optical element 21 which are in a position between the rod lenses 17a and 17b. In these known optical devices mentioned above all the optical elements are secured to each other by an optical adhesive layers 22. When the optical elements are secured to each other, the optical paths of the optical elements have to be adjusted so that the optical paths are made coincidence with each other. Thus, it is necessary to make the thickness of the optical adhesive layers 22 thick.

Optical sensors such as fiber-optic current meters or fiber-optic voltage meters, in which these known optical devices are installed, have such a problem that the sensor characteristic thereof varies in accordance with the variation of temperature in the atmosphere surrounding the sensor. In other words, the known optical sensors have an inferior temperature characteristic. That is to say, the temperature characteristic of a synthetic resin of the optical adhesive layers 22 is so large in comparison with that of the optical elements that the optical paths of the optical elements are deviated from each other by expansion or shrinkage and transformation of the synthetic resin per se due to the variation of temperature in the atmosphere surrounding the optical device.

Particularly, in case the optical sensor is used outdoors, the sensor is exposed to the atmosphere where the temperature varies in the range of about −20° C.~80° C. Thus, it is desired to provide an optical sensor such that sensor characteristic does not vary so largely even if the atmosphere surrounding the sensor is varied largely.

There has also been proposed an optical device in which optical elements A, B are separately secured to an optical bench C having a flat surface as shown in FIG. 4. However, during the procedure for securing the optical elements to the optical bench, it is necessary to make the optical paths of the optical elements identical with each other, and thus one of adhesive layers D becomes thick. Therefore, even if such an optical device is utilized in the optical sensor, the same problem as mentioned above would occur.

Further, these known optical devices have other problems in assembling. There are two assembling ways for the known optical sensors, one of them is to adhere each optical element successively and the other is to secure some optical elements previously to make some assemblies and then integrate the assemblies to complete the optical device.

It is necessary to coincide the optical paths of each optical elements with each other by adjusting the relative positions of each elements. Therefore, when securing the optical elements to each other, it is necessary to wait for a long time until the optical adhesive is hardened while maintaining the relative portions of each elements as they are. Furthermore, many assembling jigs are needed for supporting each elements in position during the assembling procedure. Thus, it is impossible to produce the optical sensor industrially because the assembling procedure is complex.

In Japanese Patent Publication No. Tokko-sho 62-45527, there is disclosed an optical device in which a plurality of V-shaped slits, which are connected to each other, are formed in a base block and optical elements are secured thereto. Then, the relative positions of the optical elements can be determined by these V-shaped slits. However, in the reflection-type and U-shaped type optical sensors shown in FIGS. 1 and 2, it is difficult to adjust the optical paths of optical elements only by the slits provided in the base block, and thus it is necessary to determine the relative positions of the optical elements by the base block as a whole including slits.

SUMMARY OF THE INVENTION

The present invention has for its object to provide an optical device which has a stable temperature characteristic against the large temperature variation in the atmosphere surrounding the optical device, and which can be manufactured easily and highly precisely.

In order to achieve the above object, the optical device according to the present invention comprises an optical bench comprising first and second supporting sections, each having at least two supporting surfaces extending in different planes; a first optical element secured on said first supporting section such that an optical axis of the first optical element is made in parallel with an intersectional line of said planes of the first supporting section; and a second optical element secured on said second supporting section such that an optical axis of the second optical element is made in parallel with an intersectional line of said planes of the second supporting section.

In the present invention, since the optical bench has the precisely processed supporting sections for securing the optical elements thereto so as to make the optical axes of the optical elements coincide with each other, it is not necessary to adjust the optical axis when the optical elements are secured to the optical bench, therefore, the thickness of the optical adhesive layers can be reduced. Thus, since the optical device is not so affected by the temperature variation in the atmosphere surrounding the optical device, the sensor characteristics can be maintained stably even if the sensor is used outdoors.

The material for use in the optical bench is not limited, but a ceramic is considered to be desirable because ceramics have excellent durability and can be manufactured easily.

Generally, the rod lens has a thermal expansion coefficient of about $115 \times 10^{-7}/°$ C. Thus, it is required that the optical bench has a thermal expansion coefficient close to that of the rod lens. If the optical bench has a thermal expansion coefficient largely different from that of the rod lens, the rod lens may be distorted when the optical adhesive adhered on the optical elements is stiffened or when the temperature of the atmosphere surrounding the optical device is varied after the optical elements have been secured to the optical bench. As a result, the optical characteristics of the rod lens will vary and thus the output of the optical sensor, in which such rod lens is installed, will vary. It has been experimentally confirmed that the material of the optical bench has preferably the thermal expansion coefficient of about $90 \sim 130 \times 10^{-7}/°$ C.

Calcium titanate series ceramics ($CaO\text{-}TiO_2$), barium titanate series ceramics ($BaO\text{-}TiO_2$), zirconia ceramics ($ZrO_2$), glass ceramics, etc. meet the above requirement for the thermal expansion coefficient. Particularly, the calcium titanate ceramics ($CaTiO_2$) have a thermal expansion coefficient of $112 \times 10^{-7}/°$ C. which closely resembles to that of the rod lens. Furthermore calcium titanate is easily manufactured.

When securing the optical elements to the supporting sections in the optical bench by means of the optical adhesive, only a few simple jigs are required. Therefore, the assembling process becomes easy and it will be possible to produce the optical sensor industrially. Moreover, since the supporting sections for securing the optical elements are provided in the optical bench, it is possible to get a desired optical path in the optical device without adjusting optical axes of the optical elements constituting the optical device.

The shape of the supporting rod is desired to be cylindrical because the securing procedure becomes much easier than if a square rod is used because the cylindrical element is contacted with the supporting sections along lines, so that the optical axis thereof can be easily and precisely made coincident with optical axes of other optical elements. Further, it is not necessary to set the orientation in the plane perpendicular to the optical axis of the cylindrical optical elements.

BRIEF DESCRIPTION OF THE DRAWINGS

FIG. 6A is a perspective view depicting a second embodiment of the reflecting-type optical device according to the present invention;

FIG. 6B is a perspective view showing the optical bench provided in the second embodiment of the reflection type optical device depicted in FIG. 6A;

FIG. 7A is a perspective view showing a third embodiment of the reflecting-type optical device according to the invention;

FIG. 7B is a plan view of the third embodiment of the reflection-type optical device shown in FIG. 7A;

DETAILED DESCRIPTION OF THE PREFERRED EMBODIMENT

The present invention will be explained in greater detail on the basis of the embodiments shown in FIGS. 5~11, however, the present invention is not limited to these embodiments. The first, second and third embodiments concern reflection type optical devices, the fourth and fifth embodiments concern U-shaped type optical devices, and the sixth and seventh embodiments concern transmission-type optical devices.

Embodiment 1

Figure 5A:
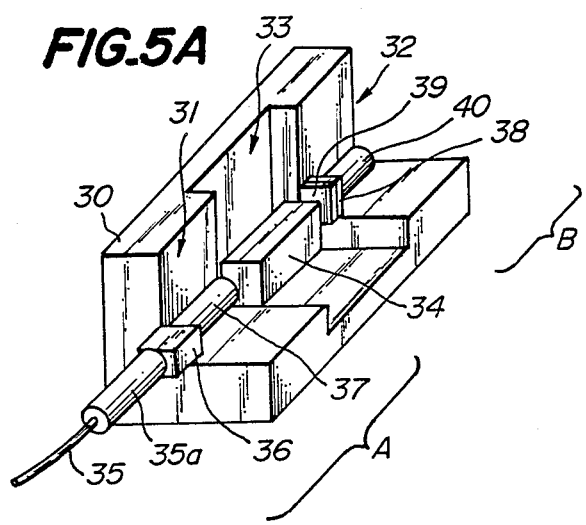
FIG. 5A is a perspective view illustrating a first embodiment of the reflection-type optical device according to the present invention.

FIG. 5A is a perspective view showing the first embodiment of the optical device according to the invention. The first embodiment comprises an optical bench 30 and a plurality of optical elements.

Figure 5B:
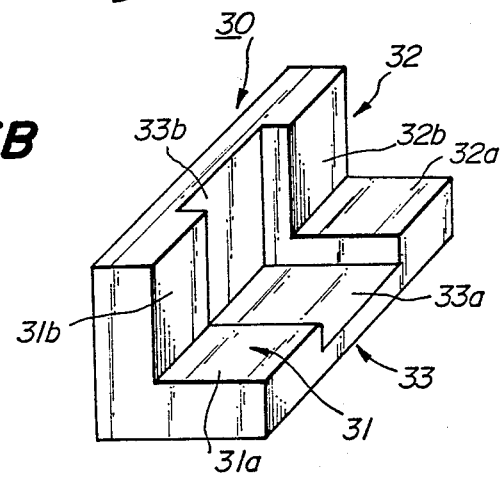
FIG. 5B is a perspective view showing the optical bench of the first embodiment of the reflection-type optical device illustrated in FIG. 5A.

The optical bench 30, as best shown in FIG. 5B, is made by $CaTiO_3$ ceramics and is substantially an L-shaped block. In the optical bench 30, there are provided first and second supporting sections 31, 32, separated from each other, for securing the optical elements. The first supporting section 31 is formed by first and second supporting surfaces 31a, 31b and the second supporting section 32 by first and second supporting surfaces 32a, 32b; each first and second supporting surfaces are extending in different planes but the first supporting surfaces 31a and 32a are formed in the same plane and the second supporting surfaces 31b and 32b are also formed in the same plane. These supporting surfaces are ground precisely by a grinder such that error in flatnesses becomes 1 μm or lower. In the optical bench 30, is further provided a third supporting section 33, between said first and second supporting sections 31 and 32. The third supporting section 33 is further concaved from the first and second supporting sections 31, 32 and also has two supporting surfaces 33a and 33b which are also precisely ground to be made flat. In the present embodiment, the supporting surfaces 31a, 32a, 33a are perpendicular to the supporting surfaces 31b, 32b, 33b.

As the optical elements, there are provided an electro-optical crystal 34 made by LiNbO₃ having its dimension of 2×4×5 mm, an optical element assembly A consisting of an optical fiber 35 supported by a ferrule 35a, a polarizer/analyzer 36 and a cylindrical rod lens 37 having its diameter of 2 mm, and an optical element assembly B consisting of a reflection mirror 38 composed of multiple dielectric coatings applied on a glass plate, a phase plate 39 and a cylindrical supporting rod 40. It should be noted that the ferrule 35a is made of alumina, the polarizer/analyzer 36 of rutile crystal (TiO₂), the phase plate 39 of crystal, and the supporting rod 40 of glass. The supporting rod 40 is secured to the supporting section 32 such that its longitudinal axis is made in parallel with an intersectional line of the surfaces 32a and 32b.

The cylindrical rod lens 37 in the assembly A is secured to the first supporting section 31 such that the optical axis of the rod lens is in parallel with an intersectional line between the supporting surfaces 31a, 31b, the supporting rod 40 in the assembly B to the second supporting section 32, and the electro-optical element 34 is secured to the third supporting section 33 by means of the optical adhesive. On opposite surfaces of the electro-optical element 34, electrodes (not shown) are formed in order to measure an electric voltage applied to the electrodes. In accordance with the voltage applied across the electrodes, the polalization condition of the light passing through the electro-optical element 34 is varied; and a variation of the light reflected by the mirror 38 is measured by an optical detector (not shown) connected to the optical fiber 35.

When 50 V alternative voltage having a frequency of 60 Hz is applied across the electrodes on the electro-optical element 34, the variation of the output signal supplied from the optical sensor was about 1%. It should be noted that the variation was measured under the condition that the sensor was in a thermostat in which the temperature of the atmosphere therein varies in the range of −20° C.∼80° C. The output signal is obtained by dividing an AC component of the photoelectric converted signal by a DC component therein, and thus, a variation of light intensity emitted by a light emitting element (Light Emitting Diode having wavelength λ of 0.85 μm), a variation of the sensitivity of the light receiving element (Photo Diode) and a variation of light loss when the light is transmitted in the optical fiber (core diameter is 80 μm) can be compensated for.

Figure 1:
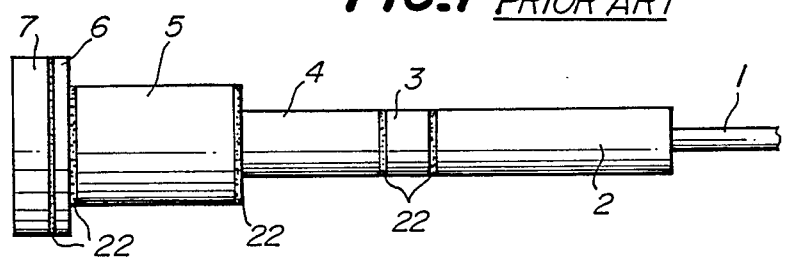
FIG. 1 is a side view showing a known reflection-type optical sensor.

Under the same measuring condition as mentioned above, the variation of the output signal in the known optical sensor shown in FIG. 1 was about 3%. Then, it is proved that the sensor characteristic of the optical sensor in which the optical device according to the first embodiment is installed is remarkably improved.

Embodiment 2

FIGS. 6A and 6B are perspective views illustrating the second embodiment of the reflection-type optical device according to the invention.

In the optical bench 41 are provided first and second V-shaped supporting sections 42 and 43 and a third flat supporting section 44 arranged between the first and second supporting sections as shown in FIG. 6B. The first and second supporting sections 42 and 43 have first supporting surfaces 42a, 43a and second supporting surfaces 42b, 43b; and the first supporting surfaces 42a, 43a, are formed in the same plane, and the second supporting surfaces 42b, 43b are also formed in the same plane. These supporting surfaces are ground precisely by a diamond grinder to be made flat, so that the optical axes of the optical elements to be secured to the first and second supporting sections are made coincident with each other without requiring the adjustment of the optical axes.

The second embodiment includes the same optical elements as those of the first embodiment except that a polarizing beam splitter 45 is used instead of the polarizer/analyzer 36. The cylindrical rod lens 37 is secured to the first supporting section 42; the cylindrical supporting rod 40 is secured to the second supporting section 43; and the polarizing beam splitter 45 and the electro-optical element 34 are secured to the third supporting section 44 in this order viewed in the light propagating direction. To the one end of the rod lens 36, is connected the optical fiber 35 supported by the ferrule 35a and to the supporting rod 40, are serially connected the reflection mirror 38 and the phase plate 39.

The output variation of the optical sensor, wherein the optical device having the above mentioned construction is installed, was measured under the same condition applied in the first embodiment; and about 0.5% of the variation was recognized.

Embodiment 3

FIG. 7A is a perspective view depicting the third embodiment of the reflection-type optical device according to the invention, and FIG. 7B is a plan view thereof. In this embodiment, the same optical elements as those used in the embodiment 2 are arranged in the same order.

As apparent from FIG. 7A, in the optical bench 46 are provided first and second U-shaped supporting sections 47 and 48; the cylindrical rod lens 37, to which the optical fiber 35 supported by the ferrule 35a is connected, is secured to the first supporting section 47 and the cylindrical supporting rod 40 is secured to the second supporting section 48. In the same manner as in the first and second embodiments, the phase plate 39 and the reflection mirror 38 are connected to the supporting rod 40. In one side wall of a third supporting section 49 arranged between the first and second supporting sections 47, 48, there are provided two U-shaped slits 50, 50 for securing the electro-optical element 34 and a step 51 for securing the polarizing beam splitter 45. As best shown in FIG. 7B, the electro-optical element 34 is secured to only a portion of the side wall arranged between the slits 50, 50 by an optical adhesive layer 50a in order to make the securing surface small. If the securing surface is large, as the temperature of the atmosphere surrounding the optical device is varied largely, the electro-optical element 34 will be distorted due to the difference of the thermal expansion coefficients between the optical bench 46 and the electro-optical element 34. As the result, the refractive index of the electro-optical element would be varied (electrostrictive strain effect) and thus the sensor characteristic of the optical sensor would be also varied.

The output variation of about 0.3% is measured in the reflection-type optical sensor according to the third embodiment under the same experimental conditions applied to the sensor of embodiment 1.

Embodiment 4

Figure 8A:
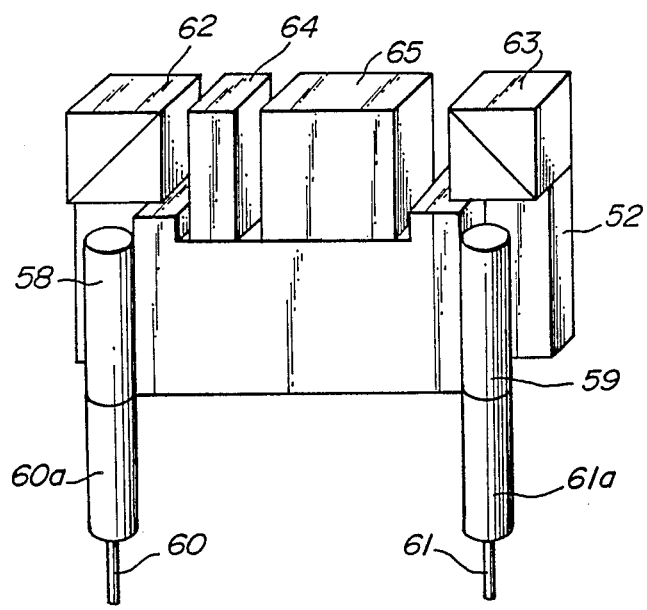
FIG. 8A is a perspective view illustrating a fourth embodiment of the U-shaped type optical device according to the invention.
Figure 8B:
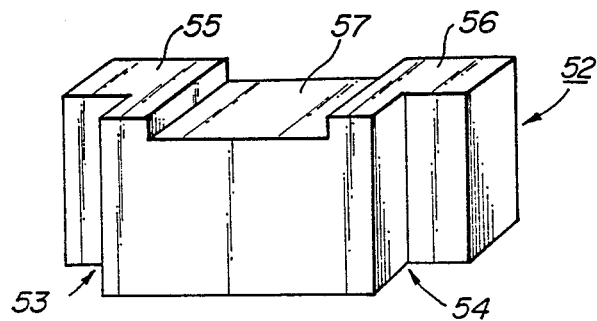
FIG. 8B is a perspective view representing the optical bench of the fourth embodiment of the U-shaped type optical device illustrated in FIG. 8A.

FIG. 8A is a perspective view representing the fourth embodiment of the U-shaped type optical device according to the invention and FIG. 8B is a perspective view showing an optical bench 52. As best shown in FIG. 8B, in the front corners of the optical bench 52, there are provided first and second supporting sections 53 and 54 which are concaved so as to form L-shaped recesses extending in the vertical direction of the optical bench 52. In the upper surface of the optical bench 52, are arranged two step portions 55 and 56; and the surfaces of these step portions are made perpendicular to intersectional lines of the surfaces which form said L-shaped recesses. Onto the first supporting section 53 is secured a first cylindrical rod lens 58 to which a first optical fiber 60 supported by a first ferrule 60a is secured; and onto the second supporting section 54 a second cylindrical rod lens 59 to which a second optical fiber 61 supported by a second ferrule 61a is connected. On the first step portion 55 is secured a polarizer 62; and on the second step portion 56 an analyzer 63. Further, on a depressed portion 57 between the first and second steps 55 and 56 are secured a phase plate 64 and an electro-optical element 65 in the order mentioned above viewed in the light propagating direction.

Figure 2:
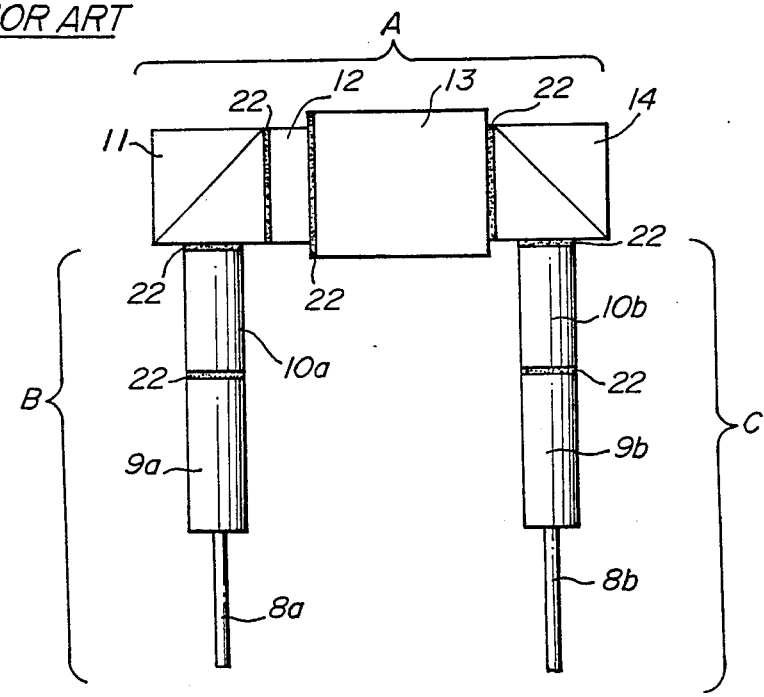
FIG. 2 is a side view representing a known U-shaped optical sensor.

The sensor characteristics of the optical sensor, in which the optical device according to the fourth embodiment is installed, was tested under the same condition as that of the first embodiment. The variation of the output of the optical sensor was about 0.5%. In contrast thereto, the variation of the output of the conventional U-shaped optical sensor shown in FIG. 2, which was also tested under the same condition, was 5%. Thus, it was proved that the temperature characteristics of the optical sensor of the invention is remarkably improved.

Embodiment 5

Figure 9A:
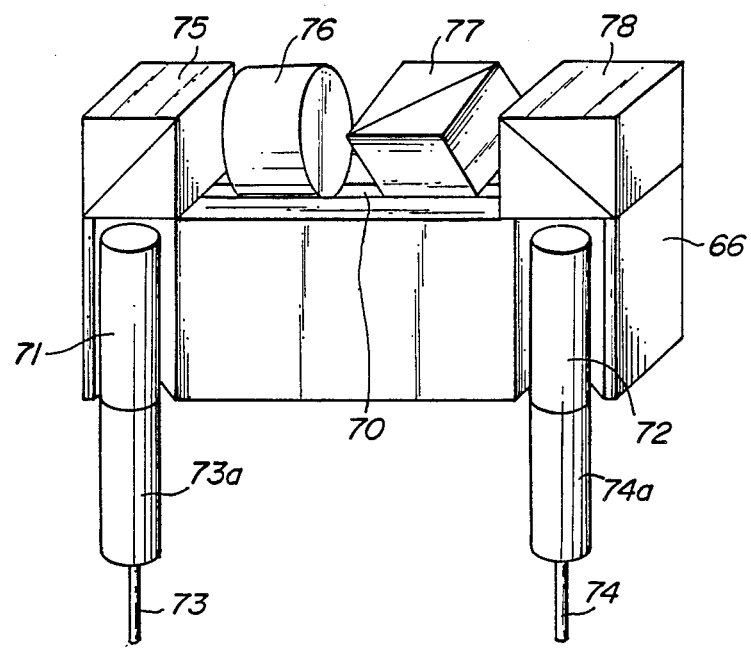
FIG. 9A is a perspective view showing a fifth embodiment of the U-shaped optical device according to the present invention.
Figure 9B:
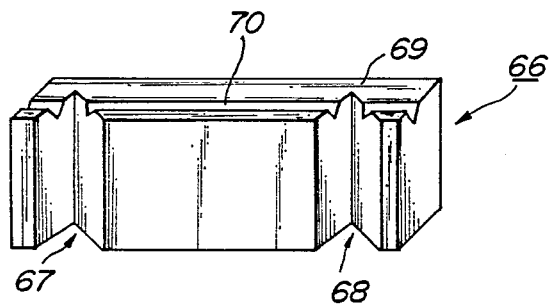
FIG. 9B is a perspective view illustrating an optical bench for use in the fifth embodiment of the U-shaped optical device shown in FIG. 9A.

FIG. 9A is a perspective view showing the fifth embodiment of the U-shaped optical device according to the invention; and FIG. 9B is a perspective view illustrating the optical bench 66 provided in the device shown in FIG. 9A.

As apparent from FIG. 9B, there are arranged first and second V-shaped supporting sections 67 and 68 extending in the vertical direction in the front corners of the optical bench 66. In the upper surface 69 of the optical bench 66, there is extended a slit 70 in the longitudinal direction of the bench beyond the first and second V-shaped recesses 67 and 68. The upper surface 69 is perpendicular to the longitudinal axes of the supporting sections 67 and 68.

Onto the first and second V-shaped recesses 67 and 68, are secured first and second cylindrical rod lenses 71 and 72, to which first and second optical fibers 73 and 74 are connected via the first and second ferrules 73a and 74a, respectively. On the upper surface 69 of the optical bench 66, there are provided a polarizer 75, a magneto-optical element 76 having its dimension of 3 mm in diameter and 1.5 mm in length, an analyzer 77 and a cubic mirror 78 in this order viewed in the light propagating direction. The polarizer 75 and the cubic mirror 78 are situated on both ends of the upper surface 69 so as to cover the first and second recesses 67 and 68, respectively. Since there is provided the slit 70 in the upper surface 69 of the optical bench 66, it is possible to secure the magneto-optical element 76 having a cylindrical body, to the optical bench in a stable manner; and the rectangular analyzer 77 can be secured to the bench also stably being inclined by 45° with respect to the upper surface 69. It should be noted that the magneto-optical element 76 is made by RIG single crystal.

When an AC magnetic field having an intensity of 200 oersteds and a frequency of 60 Hz is applied upon the thus constructed optical current sensor arranged in a thermostat where the temperature was varied in the range of $-20 \sim 80°$ C., the variation of the output signal of the sensor of about 1% was observed. While, the temperature variation of Verdet constant of the magneto-optical element (RIG) is also about 1%. Therefore, it can be said that the temperature characteristics of the optical current sensor is almost determined by the temperature characteristics of the magneto-optical element per se utilized in the sensor, and other optical elements such as the rod lenses, the polarizer, the analyzer, etc. do not affect the temperature characteristics of the optical current sensor.

Embodiment 6

Figure 10:
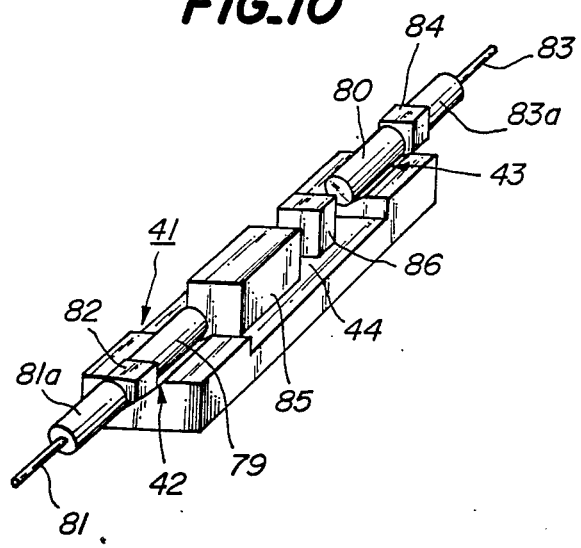
FIGS. 10 and 11 are perspective views representing sixth and seventh embodiments of the transmission-type optical device according to the present invention, respectively.

FIG. 10 is a perspective view illustrating the sixth embodiment of the transmission-type optical device according to the invention. In this embodiment, the same optical bench 41 as shown in FIG. 6B is used; and on the first supporting section 42 is secured a first cylindrical rod lens 79 and on the second supporting section 43 is secured a second cylindrical rod lens 80. On the third supporting section 44, there are provided an electro-optical element 85 and a phase plate 86. To the first rod lens 79 is connected the optical fiber 81 via the polarizer 82; and to the second rod lens 79 is also connected the optical fiber 83 via the analyzer 84.

Figure 3:
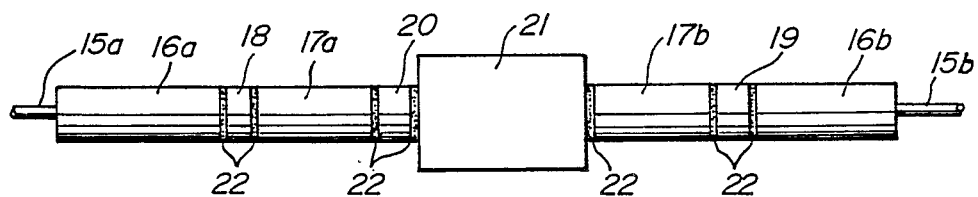
FIG. 3 is a side view depicting a known transmission-type optical sensor.
Figure 4:
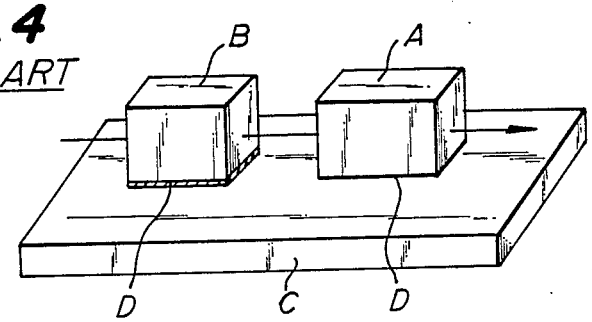
FIG. 4 is a perspective view illustrating a part of another known optical device.

The sensor characteristic of the thus structured optical voltage sensor was examined under the same experimental condition of the first embodiment, and about 1% of the temperature variation of the output was measured. In contrast thereto, the temperature variation of the output of the conventional transmission-type optical sensor shown in FIG. 3 was about 3%.

Embodiment 7

Figure 11:
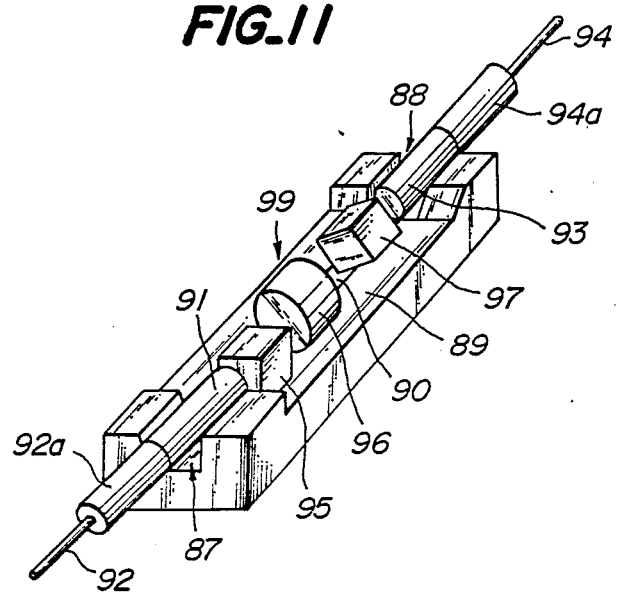

FIG. 11 is a perspective view depicting the seventh embodiment of the transmission-type optical device according to the invention.

In this embodiment, first and second U-shaped supporting sections 87 and 88 are provided in an optical bench 99; and in a third supporting section 89 situated between the first and second sections is formed a slit 90 to support the optical elements in a stable manner. On the first and second supporting sections 87, 88, the first and second cylindrical rod lenses 91, 92 are secured, respectively; and on the third supporting section, a polarizer 95, a magneto-optical element 96 and an analyzer 97 are arranged in this order viewed from the light incident side. To the end of the first rod lens 90, is connected an optical fiber 92 via a first ferrule 92a and to the end of the second rod lens 92 an optical fiber 94 supported by a ferrule 94a.

The variation of the output of the thus structured optical current sensor was about 1% under the same experimental conditions applied in the fifth embodiment.

In the reflection type optical devices, which are introduced in the first, second and third embodiments, it is desired to form the supporting rod 40 by a ceramic. Because, the ceramics have such advantages that durability is so excellent and manufacturing is easy. Further, it is desired to make the degree of parallelism between the optical axis of a light reflected by the reflection plate and the axis of the supporting rod 34 smaller than ±15′.

Moreover, in the U-shaped type optical devices, which are introduced in the above fourth and fifth embodiments, it is required to make the degree of parallelism between the first supporting section and the second supporting section ±15′ or less, because if the degree of parallelism becomes larger than ±15′, the amount of the light which passes through the optical sensor will be reduced. There is such an experimental result that when the degree of parallelism between the first supporting section and the second supporting section is ±15′, ten percent of the amount of light passing through the optical sensor is lost.

In the same manner as described above, it is desired that the degree of perpendicularity of the first and second supporting sections to the third supporting section is lower than ±15′. It is also desired that the deviation of the optical path change in its direction by 90° by means of the optical elements, such as the perpendicular prism, the cubic mirror or the polarizing beam splitter, is ±15′ or less.

In the aforementioned embodiments, a fiber collimator in which a collimator lens is integrated to an optical fiber can be used instead of the combination of the rod lens and fiber.

As explained in the above, the optical device according to the invention includes the optical bench which has at least two precisely processed supporting sections for supporting optical elements: and the supporting sections are formed by at least two supporting surfaces extending in different planes. Thus, the optical paths of the optical elements secured to the first and second supporting portions are not deviated from each other even if the temperature in the atmosphere surrounding the optical device is varied largely, and thus the optical device having stable characteristics against the temperature variation can be provided.

Particularly, in case the optical element to be secured to the first and second supporting sections has a cylindrical shape, the contacting area thereof is made minimum because the optical elements can be secured to the supporting sections by lines. Therefore, the optical device is not affected by the variation or transformation of the optical adhesive so much that the deviation of the optical axes of optical elements is not recognized.

Further, the supporting sections of the optical bench are precisely processed so as to make coincident the optical paths of the optical elements with each other without requiring the optical axis adjustment. That is to say, it is not necessary to adjust the optical paths by means of thick adhesive layers when the optical elements are secured to the optical bench, and thus the assembling process becomes easy and the deviation of the optical paths due to the deformation of the adhesive layers can be minimized.

What is claimed is:

1. An optical device for detecting an electric or magnetic field comprising:
    an optical bench comprising first, second and third supporting sections, said first and third supporting sections each having at least two supporting surfaces extending in different planes, said first and third supporting sections being separated from each other by said second supporting section;
    first optical means for projecting light in a direction parallel to an intersectional line of said planes of said first supporting section;
    second optical means for sensing the electric or magnetic field, said second optical means comprising an optical element whose optical characteristic is influenced by said electric or magnetic field and which serves to rotate a plane of polarization of the light projected from said first optical means; and
    third optical means comprising a light reflection member for reflecting light emanated from said second optical means back to the first optical member;
    wherein the optical axes of said first, second and third optical means are coaxial, and the light projected from the first optical means is transmitted into said second optical means and then reflected by the light reflection member of the third optical means back to the first optical means via the second optical means to detect the electric or magnetic field.

2. The optical device of claim 1, wherein the two supporting surfaces of the respective first and third supporting sections are arranged perpendicular to each other to form an L-shaped supporting portion in each first and second supporting section, and intersectional lines of said planes of said first and third supporting sections are coaxial.

3. The optical device of claim 1, wherein the two supporting surfaces of the respective first and third supporting sections are arranged at an acute angle to each other to form a V-shaped supporting portion in each first and second supporting section, and intersectional lines of said planes of said first and third supporting sections are coaxial.

4. The optical device of claim 1, wherein said first and third supporting sections comprise first, second and third supporting surfaces, respectively, which are perpendicular to each other to form a substantially U-shaped supporting portion in each of said first and third supporting sections, and intersectional lines of the first and second supporting surfaces of the first and third supporting sections are coaxial, and intersectional lines of the second and third supporting surfaces of the first and third supporting sections are coaxial.

5. The optical device of claim 1 wherein;
    said first optical means comprises a rod lens supported on the first supporting section adjacent said second supporting section, a polarizer/analyzer, and an optical fiber, and
    said third optical means comprises a cylindrical supporting rod supported on the third supporting section, a phase plate and a reflection mirror, said phase plate being arranged and secured to said reflection mirror, and said reflection mirror being secured to one end of said cylindrical supporting rod.

6. The optical device of claim 1, wherein said first optical means comprises a rod lens arranged adjacent said second supporting section, a polarization beam splitter and an optical fiber, said polarization beam splitter being arranged between said rod lens and said second optical means and being supported by said second supporting section.

7. The optical device of claim 6, wherein said second supporting section further comprises a step portion which determines a position of the polarization beam splitter in a direction perpendicular to the optical axes of the first, second and third optical means.

8. An optical device for detecting an electric or magnetic field comprising:

an optical bench comprising first, second and third supporting sections, said first and third supporting sections each having at least two supporting surfaces extending in different planes, said first and third supporting sections being separated from each other by said second supporting section, said first and third supporting sections being arranged such that intersectional lines of said planes of said first and third supporting sections are parallel, said second supporting section including at least one supporting surface which extends perpendicular to said intersectional lines;

first optical means for projecting light in a direction parallel to an intersectional line of said planes of said first supporting section;

second optical means for reflecting light emanating from said first optical means in a direction perpendicular to the intersectional line of said planes of said first supporting section;

third optical means for sensing the electric or magnetic field, said third optical means comprising an optical element whose optical characteristic is influenced by said electric or magnetic field and which serves to rotate a plane of polarization of the light reflected by said second optical means;

fourth optical means for reflecting light emanating from said third optical means in a direction perpendicular to a direction of optical axes of said second and third optical means and opposite to the emanating direction of the light emanating from said first optical means; and fifth optical means for receiving the light reflected by said fourth optical means;

wherein the optical axes of the first to the fifth optical means are arranged in a single plane and the light projected from the first optical means is transmitted through the second, third, fourth, and fifth optical means in order to detect the electric or magnetic field.

9. The optical device of claim 8, wherein:
said first optical means comprises a first rod lens and an optical fiber;
said second optical means comprises a polarizer arranged adjacent said first rod lens;
said third optical means comprises a phase plate and an electro-optical element;
said fourth optical means comprises an analyzer; and
said fifth optical means comprises a second rod lens arranged adjacent said fourth optical means and an optical fiber.

10. The optical device of claim 8, wherein:
said first optical means comprises a first rod lens and an optical fiber;
said second optical means comprises a polarizer arranged adjacent said first rod lens;
said third optical means comprises a magneto-optical element having a cylindrical outer surface and an analyzer;

said fourth optical means comprises a cubic mirror; and
said fifth optical means comprises a second rod lens arranged adjacent said fourth optical means and an optical fiber.

11. The optical device of claim 8, wherein said second supporting section of the optical bench comprises a V-shaped slit to engage an edge of one or more optical elements having a configuration selected from the group consisting of rectangular and circular.

12. An optical device for detecting an electric or magnetic field comprising:

an optical bench comprising first, second and third supporting sections, said first and third supporting sections each having at least two supporting surfaces extending in different planes, said first and third supporting sections being separated from each other by said second supporting section;

first optical means for projecting light in a direction parallel to an intersectional line of said planes of said first supporting section, said first optical means comprising at least one cylindrical optical element, said cylindrical optical element being supported on said first supporting section;

second optical means for sensing the electric or magnetic field, said second optical means comprising an optical element whose optical characteristic is influenced by said electric or magnetic field and which serves to rotate a plane of polarization of the light projected from said first optical means, said optical element being supported by said second supporting section; and third optical means for receiving the light emanated from said second optical means, said third optical means comprising at least one cylindrical optical element, said cylindrical optical element being supported on said third supporting section;

wherein optical axes of said first, second and third optical means are coaxial and the light projected from one end of said cylindrical optical element of said first optical means is transmitted through said second and third optical means to detect the electric or magnetic field.

13. The optical device of claim 12, wherein the two supporting surfaces of the respective first and third supporting sections are arranged at an acute angle to each other to form a V-shaped supporting portion, and intersectional lines of said planes of said first and third supporting sections are coaxial.

14. The optical device of claim 13, wherein said first and third supporting sections comprise first, second, and third supporting surfaces, respectively, which are perpendicular to each other to form a substantially U-shaped supporting portion in said first and third supporting sections, and intersectional lines of the first and third supporting surfaces of the first and third supporting sections are coaxial, and intersectional lines of the second and third supporting surfaces of the first and third supporting sections are coaxial.

15. The optical device of claim 12, wherein said first optical means comprises a rod lens, a polarizer and an optical fiber, and said third optical means comprises a rod lens, an analyzer and an optical fiber.

16. The optical device of claim 15, wherein said polarizer is secured to a light incident end of said rod lens of the first optical means, and said analyzer is secured to a light exit end of said rod lens of the third optical means.

17. The optical device of claim 15, wherein said polarizer is arranged between said rod lens of the first optical means and said second optical means, and said analyzer is arranged between said rod lens of said third optical means and said second optical means.

18. The optical device of claim 16, wherein said second optical means comprises an electro-optical element, and a phase plate is arranged between said electro-optical element and said rod lens of the third optical means.

19. The optical device of claim 12, wherein said second supporting portion of the optical bench comprises a V-shaped slit to engage an edge of at least one optical element having a configuration selected from the group consisting of rectangular and circular.

* * * * *